(12) United States Patent
Valkeapää

(10) Patent No.: US 12,188,693 B2
(45) Date of Patent: Jan. 7, 2025

(54) COOLING ARRANGEMENT

(71) Applicant: Adiabatix Oy, Vaasa (FI)

(72) Inventor: Kari Valkeapää, Vaasa (FI)

(73) Assignee: Adiabatix Oy, Vaasa (FI)

( * ) Notice: Subject to any disclaimer, the term of this patent is extended or adjusted under 35 U.S.C. 154(b) by 308 days.

(21) Appl. No.: 17/877,552

(22) Filed: Jul. 29, 2022

(65) Prior Publication Data

US 2023/0033061 A1   Feb. 2, 2023

(30) Foreign Application Priority Data

Jul. 30, 2021   (FI) ................................ 20215827

(51) Int. Cl.
   *F25B 21/04*   (2006.01)
(52) U.S. Cl.
   CPC ................... *F25B 21/04* (2013.01)
(58) Field of Classification Search
   CPC ........ F21B 21/04; H10N 10/13; F25D 23/068
   See application file for complete search history.

(56) References Cited

U.S. PATENT DOCUMENTS

| | | | |
|---|---|---|---|
| 3,823,567 A | 7/1974 | Corini | |
| 2014/0157794 A1* | 6/2014 | McGann | F25D 11/003 62/3.2 |

FOREIGN PATENT DOCUMENTS

| | | |
|---|---|---|
| DE | 10 2009 012 841 | 9/2010 |
| DE | 10 2017 213582 | 2/2019 |
| EP | 3 390 790 | 10/2018 |
| GB | 2 048 859 | 11/1980 |
| KR | 1020200035632 | 4/2020 |
| WO | 2016/135538 | 9/2016 |
| WO | 2017/085353 | 5/2017 |

OTHER PUBLICATIONS

Search Report issued for Finnish Application No. 20215827, dated Feb. 15, 2022 (2 pages).
Oct. 31, 2023 Office Action issued in German Patent Application No. 102022118941.4, pp. 1-15.

* cited by examiner

*Primary Examiner* — Elizabeth J Martin
(74) *Attorney, Agent, or Firm* — Nixon & Vanderhye PC

(57) ABSTRACT

A cooling arrangement includes an insulation module surrounding an insulated object and is formed by an internal layer, an external layer, and insulation material located between them. The external layer of the insulation module is surrounded by a protective enclosure so that at least one air gap is provided between the external layer and the protective enclosure. The insulation module has at least one exchange aperture penetrating it at least in part with the first cooling element provided to it. The second cooling element opposite to the first cooling element is provided to the external air gap so that at least one thermoelectric generator is arranged between them. The protective enclosure surrounding the insulation module is provided with a venting aperture penetrating it, and a fan utilizing the electric power produced by the thermoelectric generator is provided for increasing the efficiency of the airflow in the air gap.

20 Claims, 5 Drawing Sheets

COOLING ARRANGEMENT

This application claims priority to FI 20215827 filed Jul. 30, 2021, the entire contents of each of which are hereby incorporated by reference.

BACKGROUND OF THE INVENTION

The present invention relates to a cooling arrangement according to the preamble of the claim 1, which can significantly lower the surface temperature of a heat insulation.

It is previously known to insulate, for example, machine parts and process industry devices and pipings utilizing various technical insulation methods and solutions. The aim of such insulation is both to control the operational temperature conditions and regulate the surface temperatures of devices and their parts both as regards to occupational and fire safety.

Continuous tightening of requirements relating to insulating and occupational safety, among others, has lead to a need to improve insulating practices and solutions in use, however without increasing the insulation thickness excessively. One such solution is presented in the document EP 3 390 790, which describes a heat insulation comprising, in addition to a conventional insulation arrangement, an air gap provided by a separate outer shell layer. Such air gap provides gravitational air exchange, which can lower the surface temperate of the outer shell layer.

However, significant problems relate to the solution according to the EP document. As such, even partial blocking of the air inlet apertures quickly leads to the outer shell layer getting heated. Further, air flows in the uniform air gap quite unevenly, which correspondingly leads to local heating in the outer shell layer.

BRIEF DESCRIPTION OF THE INVENTION

The objective of the invention is to provide an insulation solution resolving the problems mentioned above for their main part.

This object is achieved by a cooling arrangement with the characteristics defined in the claims according to this invention. More specifically, the arrangement according to this invention is mainly characterized by what is presented in the characterizing part of the claim 1.

Preferred embodiments of the invention are the subject of the dependent claims.

The basis of the invention is that clearly more efficient cooling can be achieved by mechanical control of the airflow, and at the same time, the airflow can be directed clearly better to areas where it is most beneficial.

The invention provides significant benefits. As such, mechanical control of the airflow enables better directed cooling both in individual insulation modules and a wider group of insulation modules.

By utilizing thermoelectric generators installed in the insulation module for the energy supply of one or more fans maintaining the airflow, excessive wirings can be avoided. At the same time, the operation of cooling is ensured also in situations where unexpected disruptions occur in external energy sources of the equipment.

By connecting the fans to each other and a common control unit, their operation can easily be monitored and adjusted as needed.

Other benefits provided by the invention are presented below when the specific embodiments of the invention are described in more detail.

BRIEF DESCRIPTION OF THE DRAWINGS

A certain preferred embodiment (certain preferred embodiments) of the invention is described below on more detail with reference to the accompanying drawing, in which.

DETAILED DESCRIPTION OF PREFERRED EMBODIMENTS

The present figures do now show the cooling arrangement in real scale, but instead, the figures are schematic to illustrate the structure and operation of preferred embodiments in principle. In this context, the structural parts shown in the figures with reference numbers correspond to the structural parts designated with reference numbers in this description.

Figure 1:
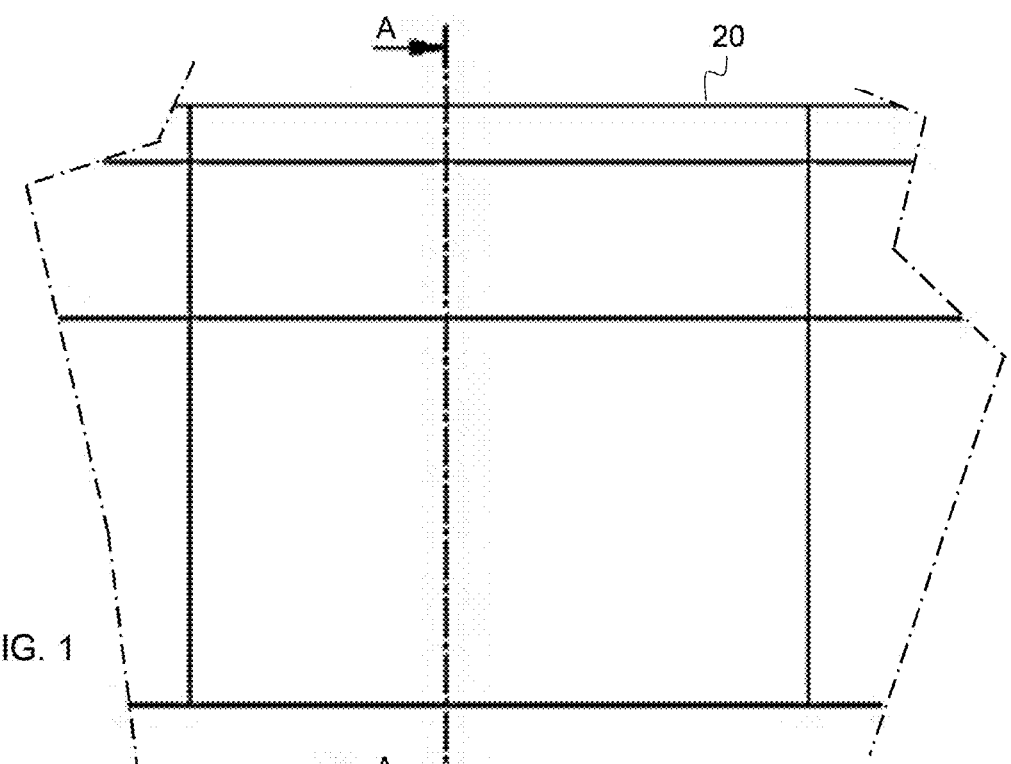
FIG. 1 shows a schematic a side view of a part of the insulation module.
Figure 2:
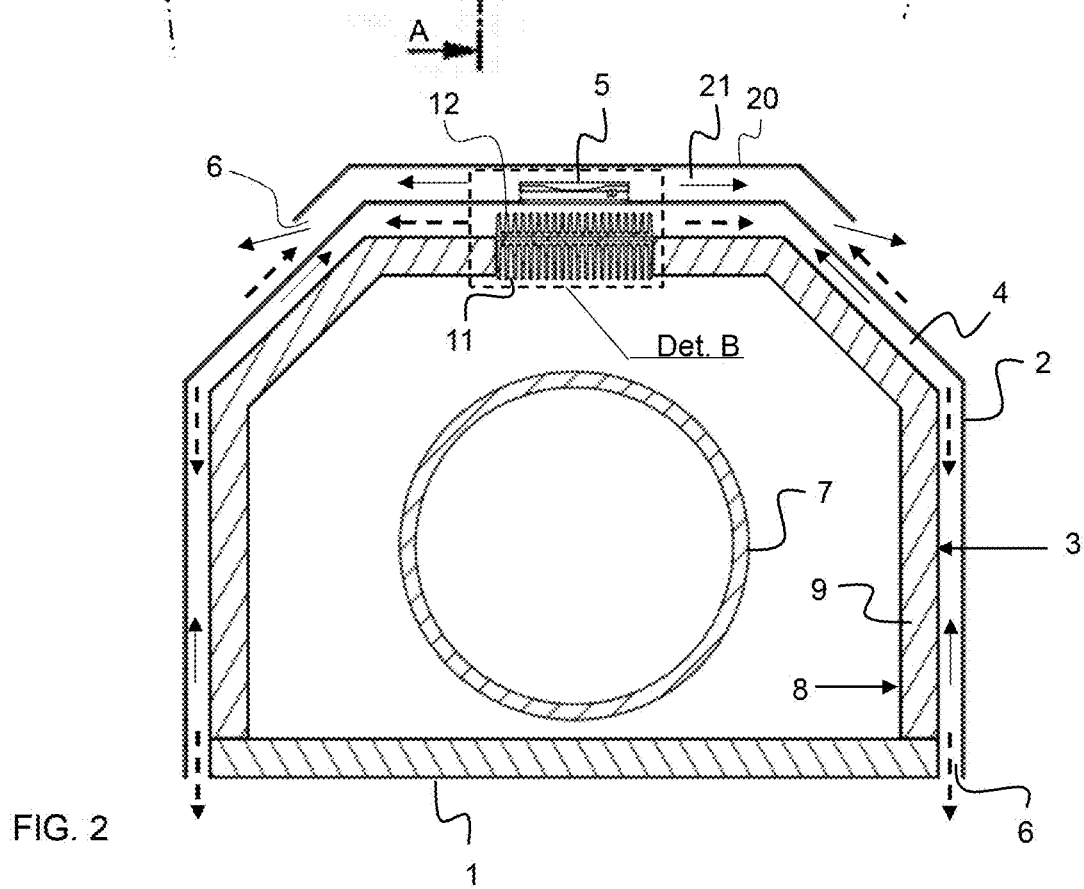
FIG. 2 shows a schematic cross-sectional view of the insulation module according to the FIG. 1 from the section A-A of the Fig. A.

As such, the FIGS. 1 and 2 show the basic concept of the present invention, in which the insulation module 1 surrounding the insulated object for its main parts is surrounded with a protective enclosure 2 at least in part, which provides an air gap 4 between the outer layer 3 of the insulation module and the protective enclosure for ventilating the insulation module. As such, an airflow sweeping the outer layer is generated in the air gap that proceeds in the gap, the height of which can be 10-50 mm as measured from the outer surface of the outer layer to the inner surface of the protective enclosure. In this solution, the generation of the airflow is ensured by adapting a fan 5 to the air gap, which either draws external air flowing to the air gap through venting apertures 6 provided in it between, for example, the lower edge of the protective enclosure and the insulation module, or blows external air flowing to the air gap trough the fan and exiting through the said venting apertures. Of course, other venting apertures penetrating the protective enclosure can also be provided in other parts of its surface, if necessary. As such, efficient airflow can be ensured in the air gap by using a fan.

Figure 3:
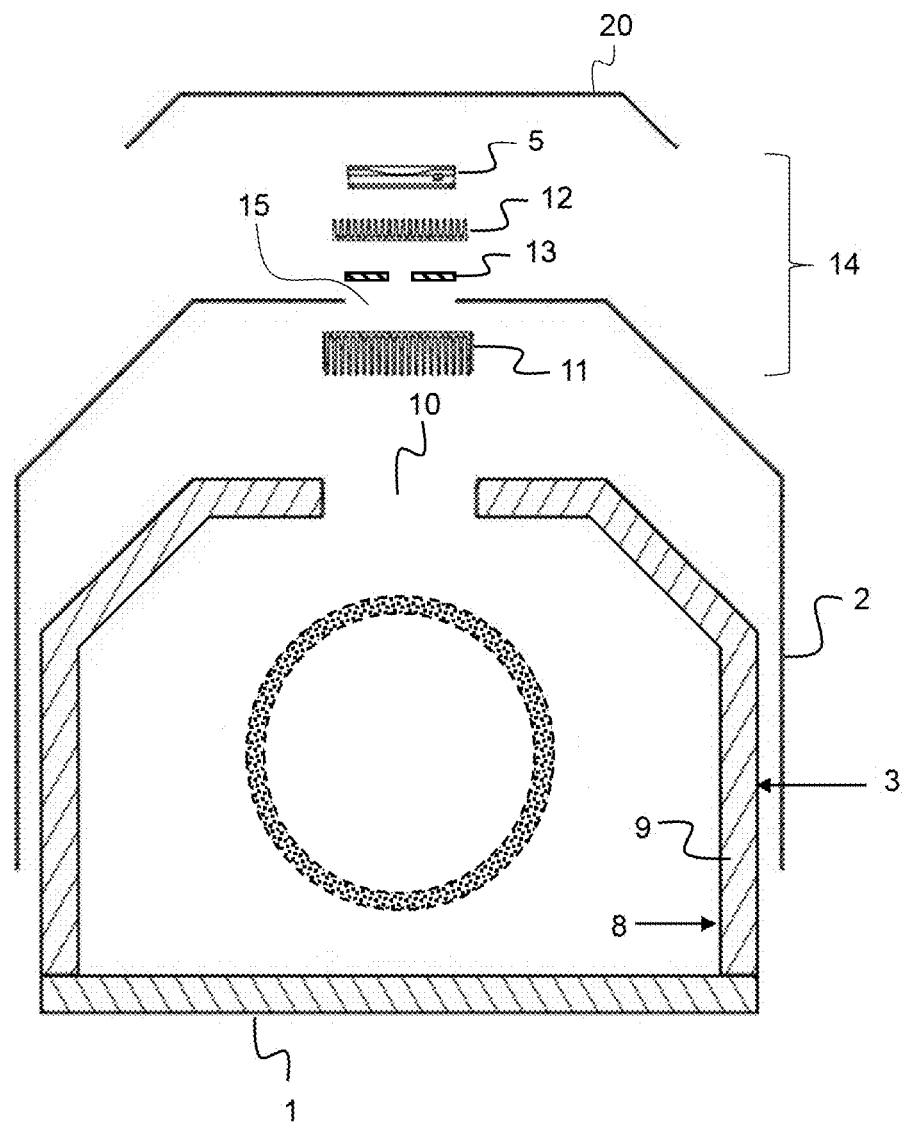
FIG. 3 shows a cross-sectional view of the insulation module according to the FIG. 2 as an exploded view.

As shown in the FIGS. 2 and 3, the said insulation module 1 comprises an inner layer 8 surrounding the insulated object 7 for its main part and the outer layer 3 mentioned above with some known insulation material 9 adapted between the inner and outer layers. The insulation module has at least one exchange aperture 10 penetrating the structural layers of the insulation module in part or entirely, and it is enclosed for its main part with the first cooling element 11 adapted to it.

In turn, a second cooling element 12 opposite to the first cooling element 11 is adapted to the external air gap 4 surrounding the insulation module 1 in a way that at least one thermoelectric generator 13 (TEG generator) is arranged between them. Hereinafter, this combination is referred to as the energy unit 14. The electric energy generated by the thermoelectric generator as a result of the effect of the temperature difference between the two cooling elements contacting each other is utilized in the fan 5, which is connected to the surroundings through a venting aperture 15 provided in the protective enclosure 2 and penetrating it. The structure is shown particularly well in the FIG. 3.

Figure 4:
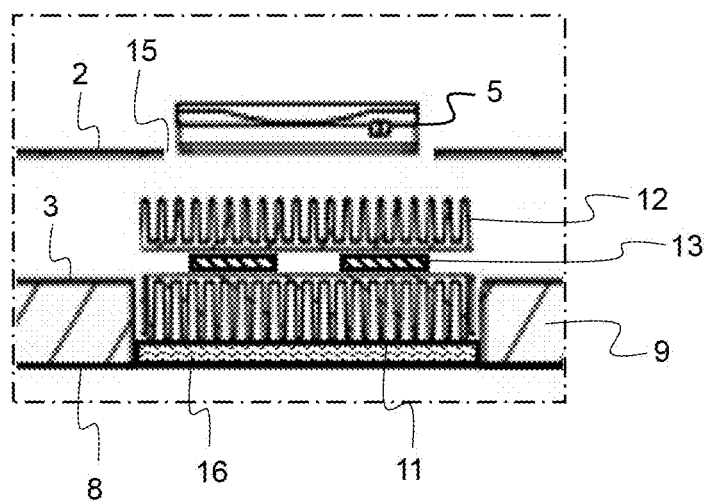
FIG. 4 shows an alternative structure for the section Det. B shown in the FIG. 2.

The exchange aperture 10 receiving the energy unit 14 can be arranged, for example, to penetrate all structural layers of the insulation module as shown in the FIG. 2. Alternatively, when the thermal load of the insulated object is sufficient, the inner layer 8 of the insulation module 1 can remain unpenetrated. Is such solution, even a thin sealing and/or insulation 16 can be arranged between the inner layer and the first cooling element 11, if necessary. Such a structure is shown in the FIG. 4. As a result of the cooling provided by the present arrangement, the connection between the exchange aperture 10 and the insulation module 1 is not required to be absolutely tight, as the airflow moving in the air gap 4 provides sufficient cooling.

The exchange aperture 10 can be formed in the insulation module quite freely with respect to the insulated object 7, and as such, it can be located, for example, above the insulated object, under it or to a side of it. Is should also be noted that while the fan 5 is located in connection with the exchange aperture and the energy unit 14 in it in the present figures, this is not obligatory at all. The fan and the energy unit can be located in different parts of the insulation module without an adverse effect on the provision of the needed airflow. Further, nothing prevents providing an additional fan to another location in the protective enclosure, if, for example, thermal load is particularly high locally or the shape of the insulation module is such that it would be difficult to achieve sufficient airflow otherwise.

Figure 5:
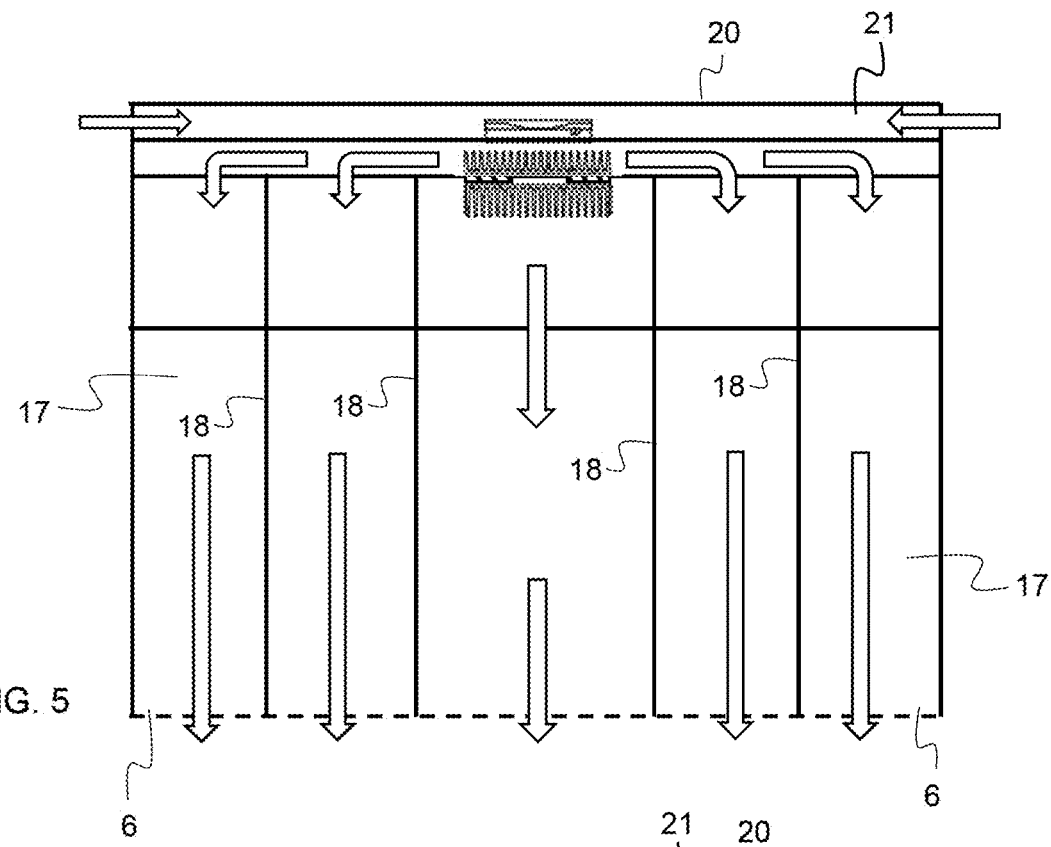
FIG. 5 shows a schematic cross-section along the air gap shown in the FIG. 2 with the airflow indicated by arrows.
Figure 6:
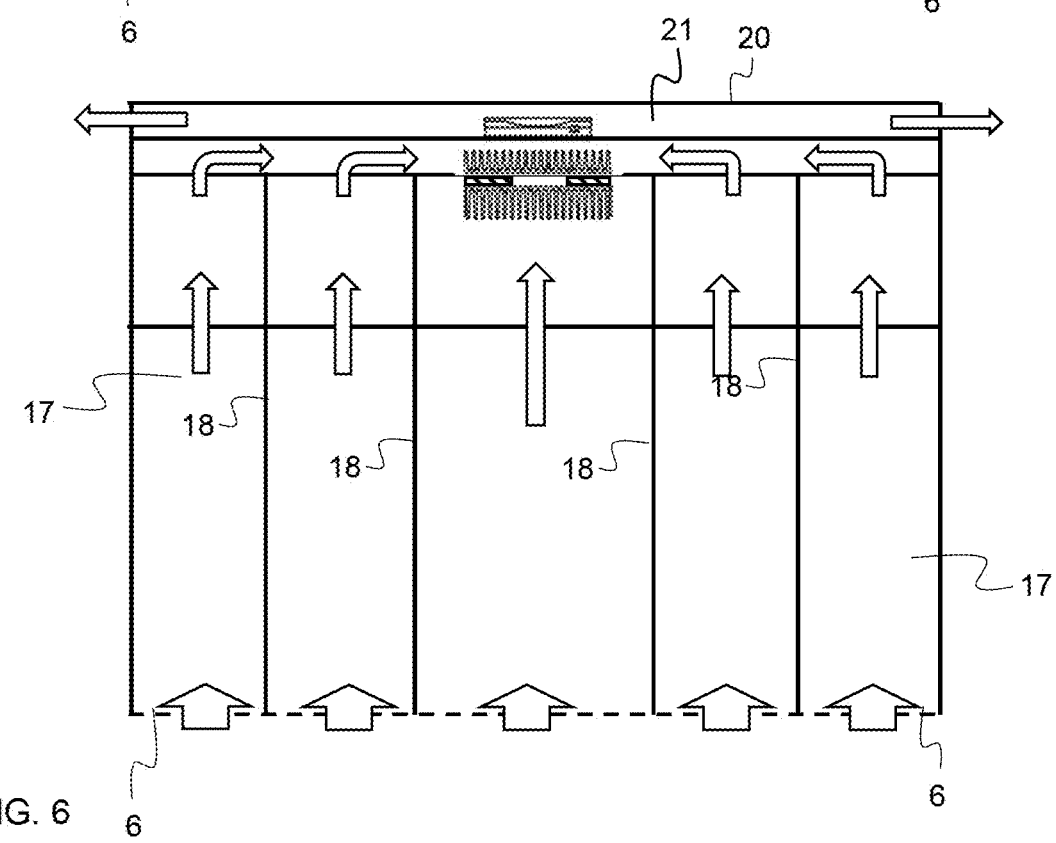
FIG. 6 shows another alternative schematic cross-section along the air gap with the airflow indicated by arrows.

In order to extend the cooling effect of the airflow to the insulation module for its most part, the air gap is preferably formed by several mainly parallel channels 17. This is shown by way of an example in FIGS. 5 and 6. While the channels are shown to have a substantially vertical orientation in the accompanying figures, the channels can also be formed more like a labyrinth. Such channels may also have even horizontal or almost horizontal sections to increase the efficiency of the heat transfer either by slowing down the flow to improve the heat transfer or by directing the flow to the parts of the insulation module 1 requiring particularly high cooling. The walls 18 separating the channels from each other can be formed like this or the cannels can be provided with separate means to disrupt the airflow moving in the air gap. As such, the purpose is to provide as abundant turbulent flow as possible instead of a laminar flow easily generated otherwise in such channels.

Figure 7:
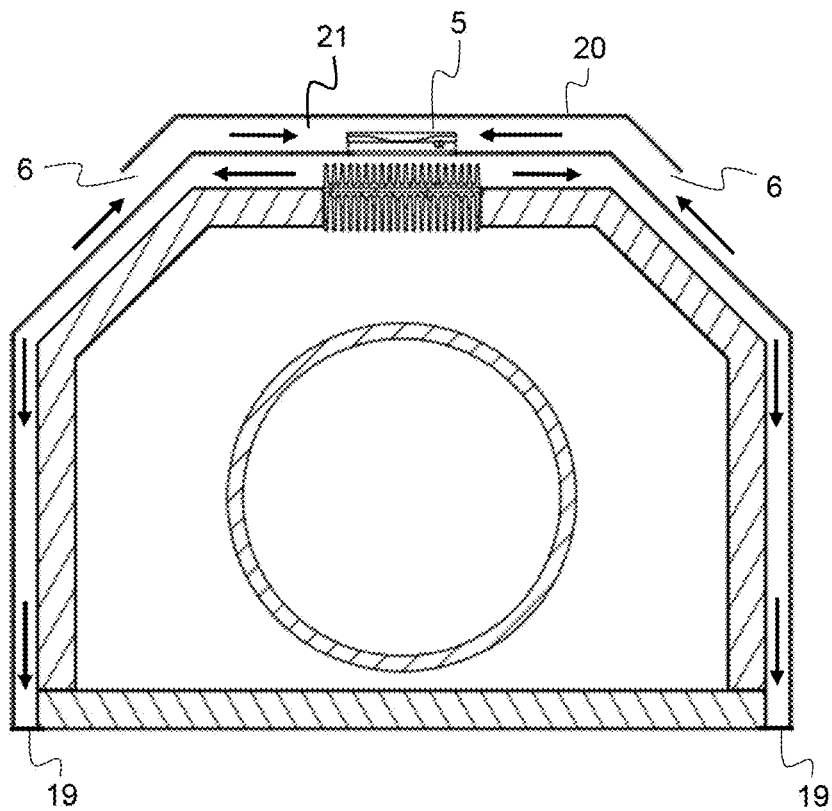
FIG. 7 shows a schematic cross-section of another insulation module according to the FIG. 1.
Figure 8:
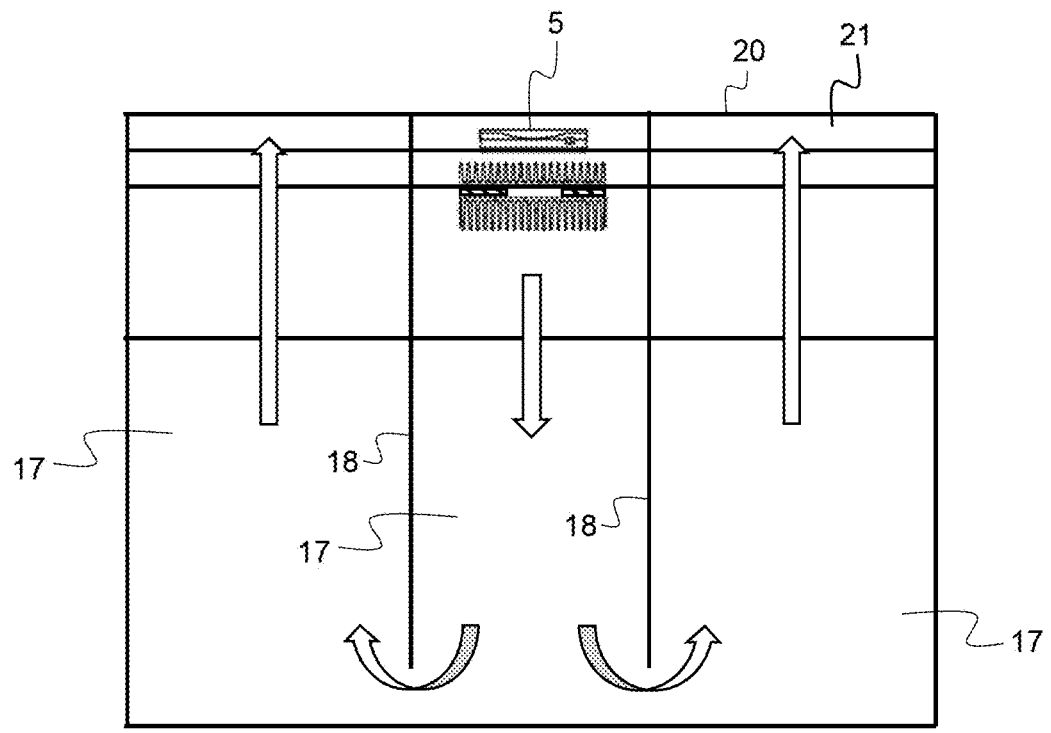
FIG. 8 shows a schematic cross-section along the air gap shown in the FIG. 7 with the airflow indicated by arrows.

It is also possible to avoid locating venting apertures 6 in the lower edge of the protective enclosure 2 by utilizing the solution according to FIGS. 7 and 8. In this case, the fan 5 guides the air from the upper part and the centre of the insulation module 1 downwards, and the air is directed to exit upwards from the edges of the insulation module. In this case, the channels 17 guiding the airflow are separated from each other by the wall 18, and the lower edge 19 between the protective enclosure and the outer layer 3 of the insulation module would be closed.

As it can be seen particularly in the FIGS. 2, 3 and 7, the fan 5 of the present cooling arrangement is preferably protected by a special splash shield 20. In order to ensure sufficient airflow, which exits or is directed to the fan, a venting gap 21 is provided between this splash shield and the protective enclosure 2. The height of the venting gap as measured from the outer surface of the protective enclosure to the inner surface of the splash shield is 10-50 mm. The splash shield prevents liquid or other impurities from entering to the fan and further inside the insulation module 1.

Figure 9:
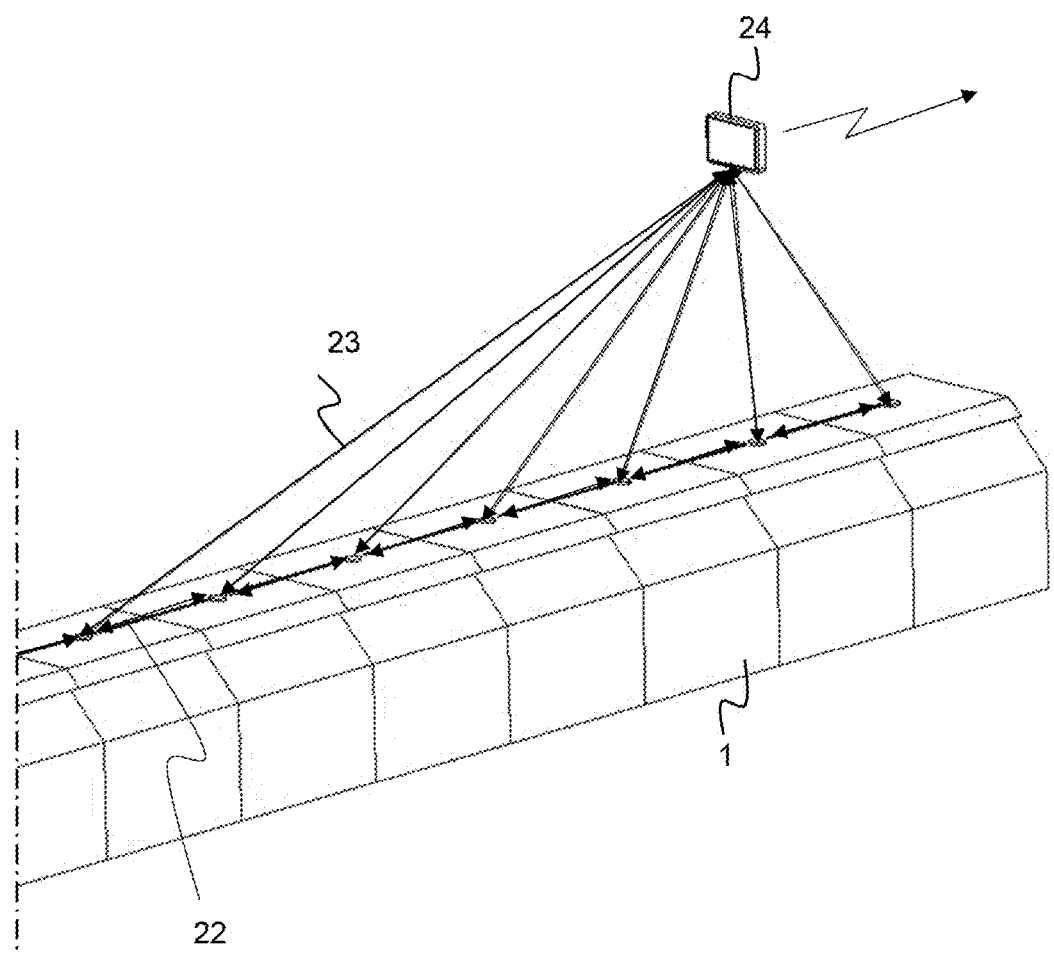
FIG. 9 shows a preferred location of the cooling arrangements around, for example, the exhaust pipe of an engine.

The operation of the fan 5 can also be ensured in arrangements where the insulation module 1 comprises, due to its size or shape or the nature of the insulated object 7, more than one fan, by connecting them to each other with a wired connection 22 to distribute the electric power from one or more thermoelectric generators to several fans as shown in the FIG. 9.

When the isolated object 7 is covered by several insulation modules 1, the fans 5 in them are, as well, preferably connected to each other with a wired connection 22 to distribute the electric power from one or more thermoelectric generators 13 to several fans.

In addition to such wired connection 22, the fan 5 or the fans can be arranged to comprise a wireless data connection 23 for monitoring and adjusting the operation of the fan or fans through a shared control unit 24. In turn, the control unit can have a wired or wireless connection to a special control unit, if necessary. It is also preferable to use this wireless data connection between the fans and the control unit for monitoring at least one sensor (not shown) in connection with one or more fans. Such sensors are adapted, for example, to locate leaks appearing inside the insulation module 1. Such sensors can be, among others, a nitrogen dioxide sensor, a carbon dioxide sensor or a temperature sensor.

It is clear for a person skilled in the art that the basic concept of the cooling arrangement can be implemented in many different ways when technology develops. As such, the present solution and its embodiments are not limited to the examples described above, but instead, they can vary within the scope of the claims.

The invention claimed is:

1. A cooling arrangement comprising:
    an insulation module surrounding an insulated object, wherein the insulation module is formed of an inner layer and an outer layer with an insulation material being provided between the inner and the outer layers, and
    a protective enclosure surrounding at least in part the outer layer such that at least one air gap is provided between the outer layer and the protective enclosure, wherein:
    the insulation module comprises at least one exchange aperture penetrating the insulation module,
    a first cooling element is provided to the at least one exchange aperture, the first cooling element at least partially enclosing the at least one exchange aperture, and
    a second cooling element opposite to the first cooling element is provided to the at least one air gap so that at least one thermoelectric generator is arranged between the second cooling element and the first cooling element,
    the protective enclosure is provided with a venting aperture penetrating the protective enclosure, and a fan utilizing electric power produced by the thermoelectric generator is provided to the venting aperture to increase the flow in the at least one air gap, and
    the at least one air gap comprises several parallel channels.

2. The cooling arrangement according to claim 1, wherein the at least one exchange aperture is provided in the insulation module at least in one of the following locations with respect to the insulated object surrounded by the insulation module: above it, below it, and to a side of it.

3. The cooling arrangement according to claim 1, wherein the fan is configured to draw air from the at least one air gap.

4. The cooling arrangement according to claim 1, wherein that the fan is configured to blow air to the at least one air gap.

5. The cooling arrangement according to claim 1, wherein the airflow in the at least one air gap is disruptable to provide a turbulent flow.

6. The cooling arrangement according to claim 1, wherein the cooling arrangement comprises a splash shield configured to protect the fan so that a venting aperture is provided between the splash shield and the protective enclosure.

7. The cooling arrangement according to claim 1, wherein at least one sensor is provided in connection with the fan to locate leaks appearing inside the insulating module.

8. The cooling arrangement according to claim 7, wherein the sensor is at least one of the following: a nitrogen oxide sensor, a carbon dioxide sensor, and a temperature sensor.

9. The cooling arrangement according to claim 1, wherein the fan comprises a wireless data connection for monitoring and adjusting its operation.

10. The cooling arrangement according to claim 1, wherein the insulation module comprises several fans connected to each other with a wired connection.

11. The cooling arrangement according to claim 1, wherein the insulated object is covered by several insulation modules, each said insulation module having a fan, the fans being connected to each other with a wired connection.

12. A cooling arrangement of an exhaust pipe of an engine, comprising:
  an insulation module surrounding the exhaust pipe of the engine, wherein the insulation module is formed of an inner layer and an outer layer with an insulation material being provided between the inner and the outer layers, and
  a protective enclosure surrounding at least in part the outer layer such that at least one air gap is provided between the outer layer and the protective enclosure, the at least one air gap is arranged to ventilate the insulation module so that an airflow sweeping the outer layer is generated in the at least one air gap, wherein:
  the insulation module comprises at least one exchange aperture penetrating the insulation module,
  a first cooling element is provided to the at least one exchange aperture, the first cooling element at least partially enclosing the at least one exchange aperture, and
  a second cooling element opposite to the first cooling element is provided to the at least one air gap so that at least one thermoelectric generator is arranged between the second cooling element and the first cooling element, and
  the protective enclosure is provided with a venting aperture penetrating the protective enclosure, and a fan utilizing electric power produced by the thermoelectric generator is provided to the venting aperture to increase the flow in the at least one air gap.

13. The cooling arrangement according to claim 12, wherein the height of the at least one air gap is 10-50 mm as measured from an outer surface of the outer layer to an inner surface of the protective enclosure.

14. The cooling arrangement according to claim 12, wherein the at least one air gap comprises several parallel channels.

15. The cooling arrangement according to claim 12, wherein the cooling arrangement comprises a splash shield configured to protect the fan so that a venting aperture is provided between the splash shield and the protective enclosure.

16. The cooling arrangement according to claim 12, wherein at least one sensor is provided in connection with the fan to locate leaks appearing inside the insulating module.

17. The cooling arrangement according to claim 16, wherein the sensor is at least one of the following: a nitrogen oxide sensor, a carbon dioxide sensor, and a temperature sensor.

18. The cooling arrangement according to claim 12, wherein the fan comprises a wireless data connection for monitoring and adjusting its operation.

19. An engine comprising the cooling arrangement of claim 1.

20. The engine of claim 19, further comprising an exhaust pipe, wherein the insulated object is the exhaust pipe.

* * * * *